United States Patent [19]

Ishikawa et al.

[11] Patent Number: 5,561,495
[45] Date of Patent: Oct. 1, 1996

[54] FOCUSING METHOD IN PHOTOLITHOGRAPHY

[75] Inventors: Eiichi Ishikawa; Ichiro Arimoto; Junichi Kanbe, all of Hyogo, Japan

[73] Assignee: Mitsubishi Denki Kabushiki Kaisha, Tokyo, Japan

[21] Appl. No.: 452,610

[22] Filed: May 25, 1995

[30] Foreign Application Priority Data

Aug. 5, 1994 [JP] Japan ..................... 6-184905

[51] Int. Cl.$^6$ .................................. G03F 7/207
[52] U.S. Cl. .................. 355/53; 355/77; 355/55
[58] Field of Search ................... 355/53, 55, 63, 355/77; 250/548, 559.22, 559.27, 559.39, 201.2; 356/400, 401

[56] References Cited

U.S. PATENT DOCUMENTS

| | | | |
|---|---|---|---|
| 4,902,900 | 2/1990 | Kamiya et al. | 250/548 |
| 5,124,562 | 6/1992 | Kawashima et al. | 250/548 |
| 5,266,790 | 11/1993 | Markle et al. | 250/201.2 |
| 5,364,051 | 11/1994 | Suzuki et al. | 250/201.2 |
| 5,461,237 | 10/1995 | Wakamoto et al. | 250/548 |

Primary Examiner—Joan H. Pendegrass
Assistant Examiner—David A. Lane
Attorney, Agent, or Firm—Lowe, Price, LeBlanc & Becker

[57] ABSTRACT

A level $F_A$ at a shot center of a specified shot is measured. A level $F_B$ is measured at a nonexposure region. A level difference $\Delta F$ is calculated based on the level $F_A$ at the shot center and the level $F_B$ at the nonexposure region. After the level difference $\Delta F$ is calculated for all the specified shots, an average value $\Delta F_{ave}$ of level differences $\Delta F$ is calculated. Thereafter, focusing based on the average value $\Delta F_{ave}$ and subsequent exposure are executed for the respective shots in a step-and-repeat manner. Thereby, a focusing method in photolithography enables formation of elements having good pattern configuration even if the pattern is miniaturized to a higher extent in accordance with high integration.

5 Claims, 12 Drawing Sheets

FOCUSING METHOD IN PHOTOLITHOGRAPHY

BACKGROUND OF THE INVENTION

1. Field of the Invention

The present invention relates to a focusing method in photolithography. In particular, the present invention concerns with an exposing system in which a mask pattern is successively transferred to predetermined regions of a wafer surface through a reducing projection lens in a step-and-repeat manner, and specifically relates to a method of focusing exposure light for each predetermined region before radiation of the exposure light in the exposing system

2. Description of the Background Art

A step-and-repeat photolithographic system with demagnification is a kind of projection exposure system for transferring a pattern provided at a mask onto a resist. This step-and-repeat photolithographic system with demagnification employs a step-and-repeat method and includes a mechanism executing this method.

In the step-and-repeat method, exposure is performed each time a wafer on a two-dimensionally movable X-Y stage is fed a constant distance in the process of transferring a mask pattern onto a resist. The exposing method by this step-and-repeat photolithographic system with demagnification will be described below.

FIG. 8 shows a conventional step-and-repeat photolithographic system with demagnification during an exposing process. Referring to FIG. 8, a light source 511 radiates light beams (g-ray or i-ray) of a mercury lamp to a glass mask (reticle) 515 through a condenser lens 513. The light beams passing through glass mask 515 are projected onto a photoresist on a wafer 50 through a reducing projection lens 501.

In the above step-and-repeat photolithographic system with demagnification, a region of about 15 mm×15 mm can be exposed at one time (one shot). Therefore, wafer 50 is exposed a shot each time wafer 50 is moved by an X-Y stage 502 provided for successively and automatically moving it in the X and Y directions.

Wafer 50 is vacuum-fixed on X-Y stage 502.

Although the above method in which the wafer is exposed a shot in accordance with the step-and-repeat manner provides a throughput lower than that in an entire wafer transferring method, it can provide the following advantages (1) and (2). (1) Since the projection area is reduced, it is possible to use a lens having a similar size but a larger numerical aperture (NA), so that it can provide a pattern having good resolution and size controllability. (2) Owing to the small projection area, distortion of an image by the lens can be suppressed, so that highly accurate positioning is allowed. In the process of exposing the wafer by this step-and-repeat photolithographic system with demagnification for forming a pattern of high resolution, an important factor exists in focusing of the exposure light prior to the exposure process. This focusing of exposure light is generally performed by an automatic focusing mechanism provided at the step-and-repeat photolithographic system with demagnification.

FIG. 9 schematically shows a structure of a conventional automatic focusing mechanism used in the step-and-repeat photolithographic system with demagnification. Referring to FIG. 9, the automatic focusing mechanism includes a light-emitting diode (LED) 503, condenser lens 504, projection slit 505, projection lens 506, receiving lens 507, oscillator 508, receiving slit 509 and detector 510.

Laser beams emitted from LED 503 pass through condenser lens 504, projection slit 505 and projection lens 506 and impinge on the surface of wafer 50. The laser beams reflected by the surface of wafer 50 pass through receiving lens 507 and are reflected at a predetermined angle by oscillator 508, and then the laser beams are received by detector 510 through receiving slit 509. Detector 510 detects the intensity of laser beams.

In the step of focusing the exposure light, wafer 50 is cover with a photoresist applied thereto.

Based on the intensity of laser beams detected by the detector, the system detects a level or vertical position of the surface portion of wafer 50 to which the laser beams are radiated. In order to attain the optimum focusing of the exposure light with respect to the level of the surface, X-Y stage 502 is vertically moved (i.e., in the z-direction) relatively to reducing projection lens 501. Thereby, the surface of wafer 50 receiving the laser beams is adjusted to occupy the optimum position with respect to reducing projection lens 501.

Then, a process of processing a wafer by one step-and-repeat photolithographic system with demagnification will be described below.

FIG. 10 is a flow chart schematically showing the process of processing the wafer by the step-and-repeat photolithographic system with demagnification. FIG. 11 is a flow chart schematically showing a level difference measuring step 131b and a focal position adjusting step 133 in a focusing step 130 in FIG. 10.

FIG. 12 is a schematic plan of the wafer showing an exposure region formed of a plurality of shot regions and a nonexposure region. FIG. 13 is a schematic plan showing a radiation position of laser beams in one shot.

Referring mainly to FIG. 10, a semiconductor wafer is transported into a step-and-repeat photolithographic system with demagnification (step 110). Thus, the wafer is laid on the X-Y stage and vacuum-fixed thereto. Alignment operation is performed for accurately aligning a mask pattern to be transferred with respect to the wafer (step 120). In this state, focusing with respect to the wafer is performed (step 130). This focusing step 130 includes level difference measuring step 131b and focal position adjusting step 133.

First, a predetermined number of shots are specified for measuring a level difference (ΔF) at level difference measuring step 131b. More specifically, as shown in FIG. 12, an exposure region 57 on the wafer surface is formed of a plurality of shots 55 each defined by alternate long and short dash line. Shot 55 is a region to be exposed at a time in a step-and-repeat method by the step-and-repeat photolithographic system with demagnification. Shots 55 include chip regions 51, i.e., regions which will form chips, and dicing line regions 53 located between chip regions 51. Among these plurality of shots 55, a predetermined number of shots 55 are specified.

Referring mainly to FIG. 11, operation is performed to measure a level $F_A$ of a central portion (shot center) of one shot 55 among specified shots 55 (step 201). Thus, as shown in FIG. 13, laser beams 70 are radiated to a position 55a which can be deemed to be a substantially central position of shot 55, and level $F_A$ is detected based on the intensity of reflected beams of laser beams 70 as already described with reference to FIG. 9.

Then, the X-Y stage moves predetermined distances in the X and Y directions (step 203 in FIG. 11). Thereby, the radiation position of laser beams 70 are set at a reference position 55b which is in the same shot 55 as the central position 55a but is spaced by a predetermined distance therefrom. Reference position 55b is set at a substantially flat region 63 on the wafer surface in the shot 55.

In the chip region, surfaces of repetitive regions are flatter than that of the other region. Therefore, if the chip is, for example, a DRAM (Dynamic Random Access Memory), reference position 55b is set at a memory cell region MC which is the repetitive region.

Then, laser beams 70 are radiated to this reference position 55b to measure a level $F_B$ of position 55b (step 205 in FIG. 11).

Based on level $F_A$ of shot center 55a and level $F_B$ of reference position 55b, a difference $\Delta F$ between these levels is obtained (step 207 in FIG. 11). Thus, as shown in FIG. 14, the level difference $\Delta F$ is equal to a value $(F_B - F_A)$ obtained by subtracting level $F_A$ of shot center 55a from level $F_B$ of reference position 55b forming the reference surface.

FIG. 14 is a fragmentary cross section of the wafer showing a structure including two chip regions 51 and dicing regions 53 in one shot 55. FIG. 14 also shows a structure in which shot center 55a is located at a dicing line region DL and reference position 55b is located at a memory cell region MC.

The shot center may be located at memory cell region MC as shown in FIG. 15. FIG. 15 shows a structure in which three chip regions 51 and dicing line regions 53 are included in one shot.

Operation is repeated to obtain level difference $\Delta F$ in all the specified shots (step 209 in FIG. 11). After the level difference $\Delta F$ is obtained in all the specified shots, an average value $\Delta F_{ave}$ of level differences $\Delta F$ in the respective shots is calculated (step 211 in FIG. 11).

After the calculation of average $\Delta F_{ave}$ of the specified shots, operation is performed in the step-and-repeat manner as shown in FIG. 10, and more specifically, the focal position adjustment (step 133) and exposure with beams focused to this focal position (step 140) are performed for each shot.

Initially in the focal position adjusting step 133, a level $F_{A1}$ of the shot center is measured in each shot to be exposed (step 221) as shown in FIG. 11.

Then, the optimum focusing position is determined based on level $F_{A1}$ of the above shot center, average value $\Delta F_{ave}$ of level differences obtained at the above level difference measuring step 131b and focus offset $F_0$ (step 223 in FIG. 11). Thus, as shown in FIG. 14, the optimum focusing position (surface) $F_s$ is determined by adding average value $\Delta F_{ave}$ and focus offset $F_0$ to level $F_{A1}$ ($F_A$) of the shot center $(F_{A1} + \Delta F_{ave} + F_0)$.

Then, the X-Y stage is vertically moved in the Z-direction relatively to the reducing projection lens for focusing the exposure light onto the optimum focusing position $F_s$ (step 225 in FIG. 11).

Referring mainly to FIG. 10, the exposure for one shot is then performed, so that the mask pattern is transferred onto the photoresist (step 140).

Then, the X-Y stage moves in the X and Y directions to enable exposure of the next shot (step 150). In this manner, the focal position adjusting step 133 and exposing step 140 are repeated for a plurality of shots (step 160).

After the mask pattern for all shots was transferred, the wafer is removed from the step-and-repeat photolithographic system with demagnification (step 170).

According to the conventional focusing method in the photolithography, level $F_B$ of reference position 55b (i.e., reference surface) is measured for obtaining the level difference $\Delta F$. Since the level $F_B$ of the reference surface represents a value which is utilized as the reference for obtaining the optimum focusing position, it is desired that the value is accurate. For this reason, the repetitive pattern region having a flatter surface than other region in the chip is employed as the reference surface. Thus, the repetitive pattern region has a relatively flat surface, so that the intensity of laser beams for measuring the level, which are radiated onto the repetitive pattern region and are reflected thereby, is hardly affected by the level difference of the surface, and thus the surface level can be accurately obtained.

However, even if the repetitive pattern region is used as the reference surface, failures, e.g., in the pattern configurations are caused if the degree of integration is increased. This will be described below.

(1) Sizes of a spot of laser beams 70 used for level measurement has a length L of 2 mm and a width W of 150 μm on the wafer as shown in FIG. 13. Therefore, repetitive pattern region 63 receiving the laser beams must occupy a planar area of sizes not smaller than those of laser beam spot 70. If the repetitive pattern region 63 has the area of sizes not smaller than those of laser beam spot 70, laser beams 70a are applied to and reflected by only the repetitive pattern region 63 as shown in FIG. 16. Therefore, the level of repetitive pattern region 63 forming the reference surface can be measured accurately.

However, if the repetitive pattern region 63 did not have the area of sizes not smaller than those of laser beam spot 70, laser beam spot 70 would protrude from the repetitive pattern region 63 as shown in FIG. 17. In this case, laser beams 70a would be radiated also onto region 61 at different levels, so that the intensity of reflected laser beams 70a would vary, and thus the level would not be measured accurately.

(2) Some kinds of ICs (Integrated Circuits) such as logic LSIs (e.g., ASICs (Application Specific Integrated Circuits)) do not have a region such as a repetitive region which cannot be deemed as a flat region. In this case, it is impossible to measure accurately a level of the region to be utilized as the reference surface by radiation of laser beams.

Under the conventional design rule up to about 0.8 μm, the exposure device has a sufficient margin with respect to the design rule, and has a sufficiently large focal depth. For the logic LSIs such as ASICs, the focus is not set individually for respective types of circuits, but a uniform focus setting is effected on all the products designed under the same rule. However, elements have now been miniaturized to a higher extent in accordance with high integration, and thus some kinds of elements are now produced under the design rule not more than 0.6 μm, so that it is demanded to set the focal depth under severer conditions.

Under the above design rule set for further miniaturization, if the level of reference surface were not measured as described in the above cases (1) and (2), it would be impossible to perform optimum focusing of the exposure light. This would cause failure in pattern configuration, e.g., during formation of the pattern.

SUMMARY OF THE INVENTION

Accordingly, it is an object of the invention to provide a focusing method in photolithography which can produce elements having good pattern configurations even if the pattern is further miniaturized in accordance with high integration.

The present invention provides a focusing method in photolithography, in which, for a process of successively transferring a mask pattern through a reducing projection lens onto each of predetermined regions of a wafer surface in a step-and-repeat manner so as to expose the wafer surface to provide a first region formed of a plurality of the predetermined regions exposed to exposure light and a second region not exposed to the exposure light, focusing of the exposure light is performed for each of the predetermined regions prior to radiation of the exposure light, and which includes the following steps.

A surface level is measured at a first predetermined position in the specified predetermined region among the plurality of predetermined regions. A surface level is measured at a second predetermined position in the second region. A difference between the surface level at the first predetermined position and the surface level at the second predetermined position is calculated. A surface level is measured at a third predetermined position corresponding to the first predetermined position in the predetermined region arbitrarily selected from the plurality of predetermined regions. An optimum focal position at the arbitrarily selected predetermined region is determined based on the level difference and the surface level at the third predetermined position. A positional relationship between the wafer and the reducing projection lens is adjusted so as to focus the exposure light onto the optimum focal position.

According to the focusing method in photolithography of the invention, a reference surface is formed of a wafer surface located under a nonexposure region. This region is not exposed to the exposure light, and will not be provided with a chip, so that its surface is substantially flat. Also it is easy to ensure sizes of this region such that a spot of laser beams do not protrude therefrom. Therefore, the level of the reference surface can be accurately measured. Accordingly, failure in a pattern configuration for photolithography can be suppressed even if elements are integrated to a higher extent.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

An embodiment of the invention will be described below with reference to the drawings.

Figure 10:
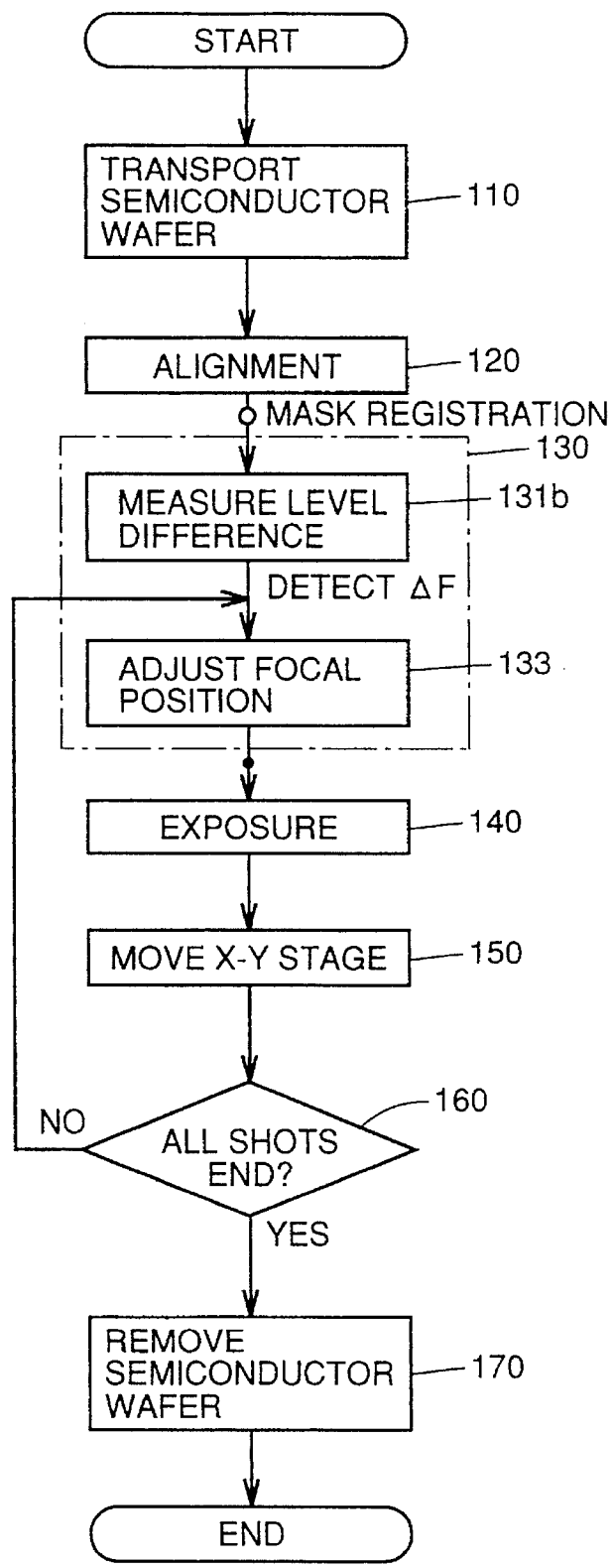
FIG. 10 is a flow chart showing a general process of processing a wafer in a step-and-repeat photolithographic system with demagnification.
Figure 11:
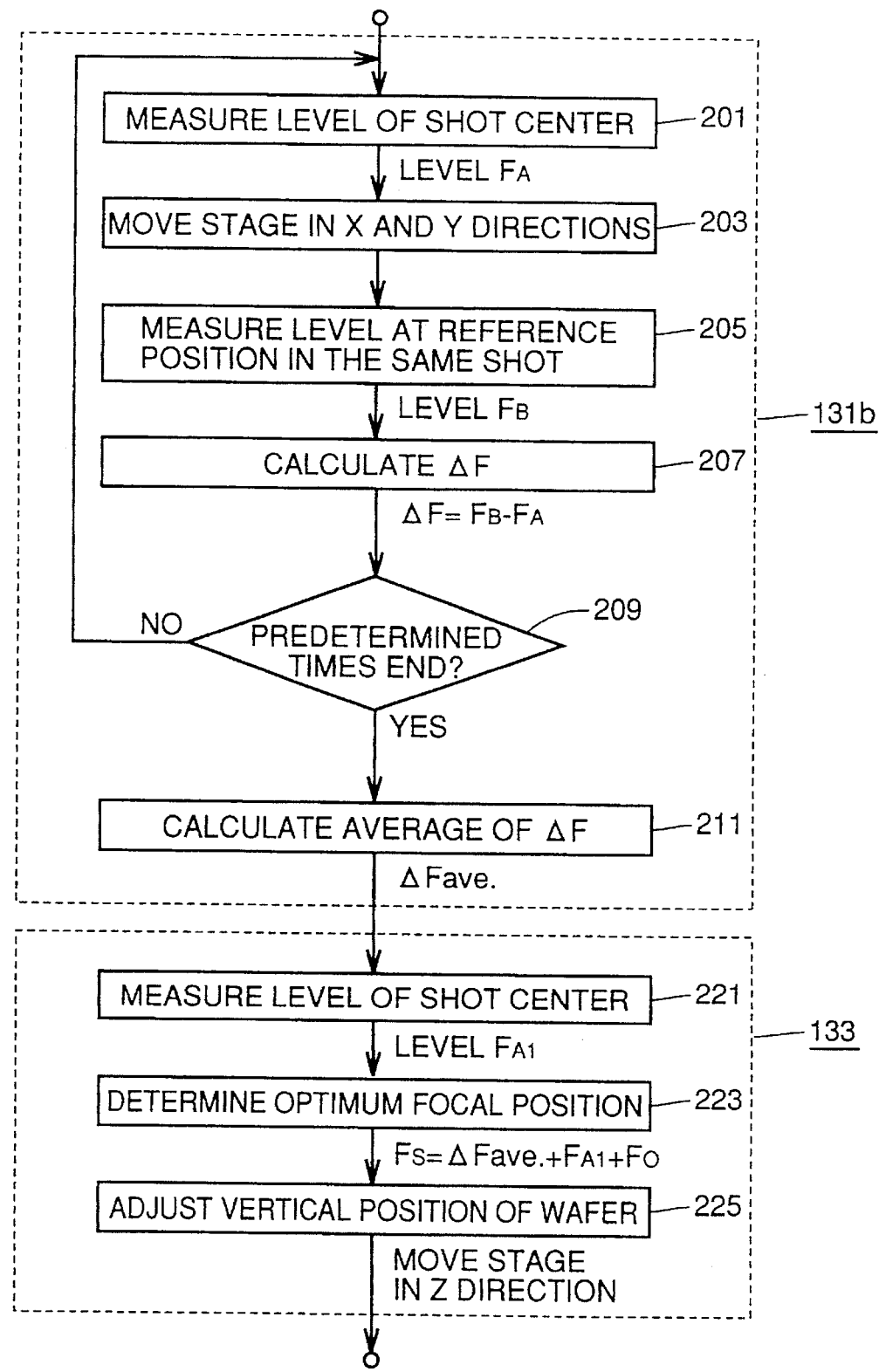
FIG. 11 is a flow chart schematically showing a conventional focusing step in photolithography.
Figure 12:
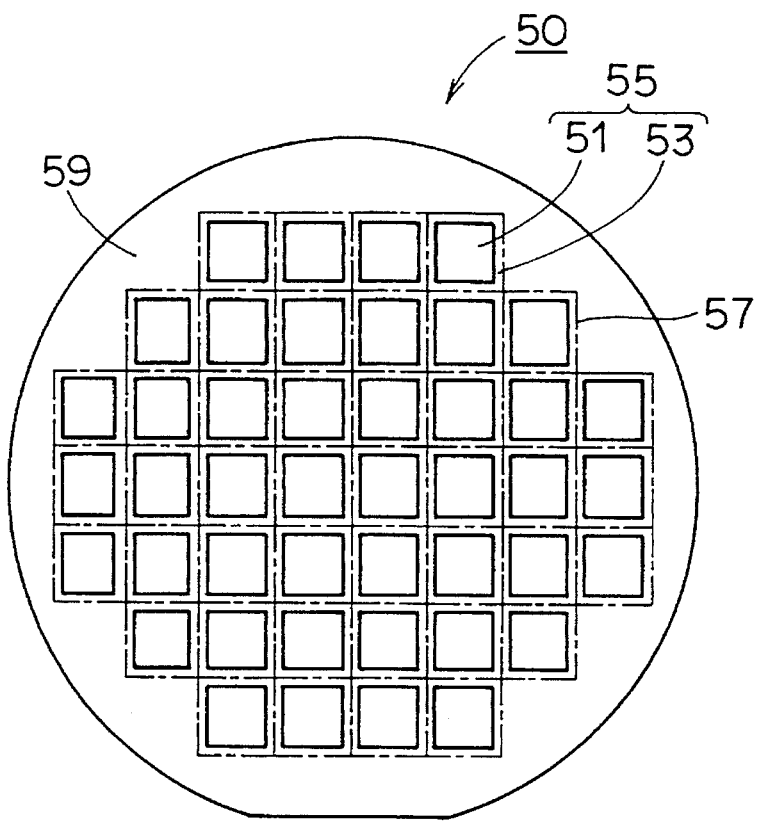
FIG. 12 is a plan schematically showing a structure of a wafer at which shot regions are set.
Figure 13:
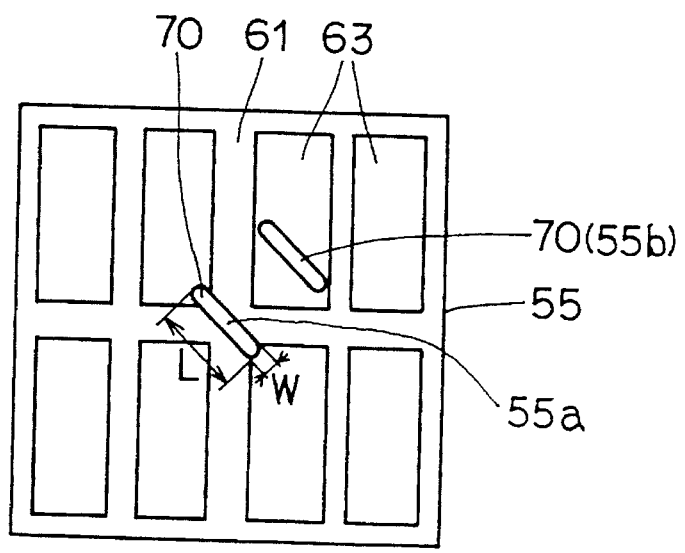
FIG. 13 is a schematic plan showing a radiation position of laser beams in one shot.
Figure 14:
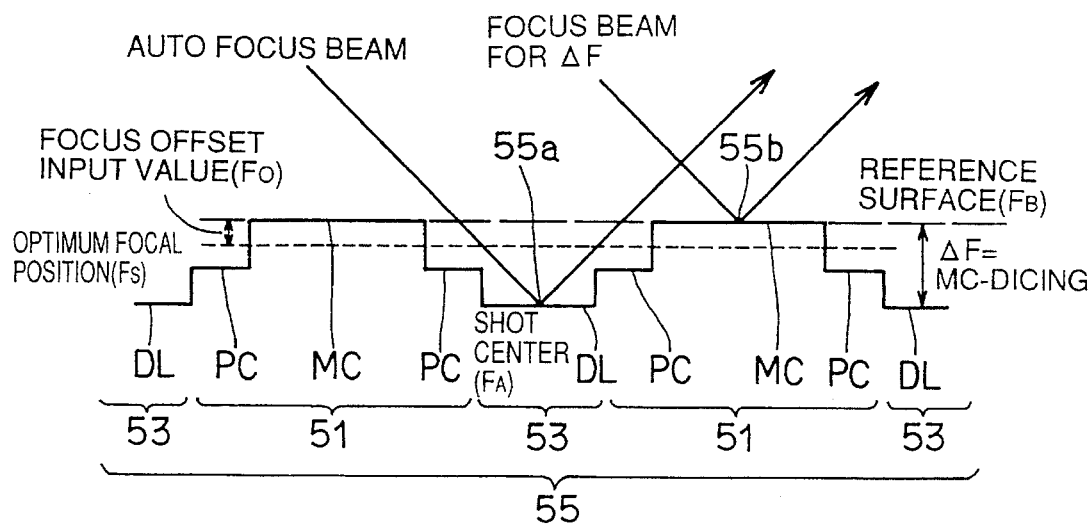
FIG. 14 is a schematic cross section of a wafer showing conventional calculation of an optimum focal position in the case where a shot center is set at a dicing line region.
Figure 15:
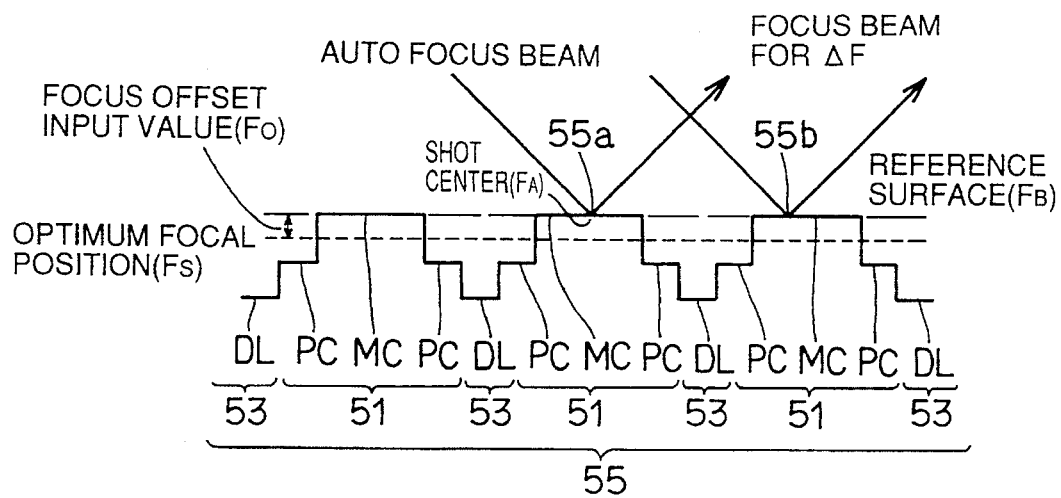
FIG. 15 is a schematic cross section of a wafer showing conventional calculation of an optimum focal position in the case where a shot center is set at a memory cell region.
Figure 16:
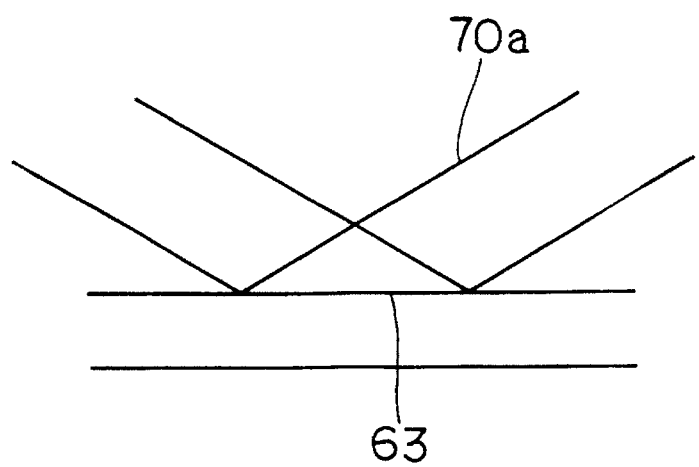
FIG. 16 is a schematic side view showing a state that laser beams are radiated onto a repetitive region.
Figure 17:
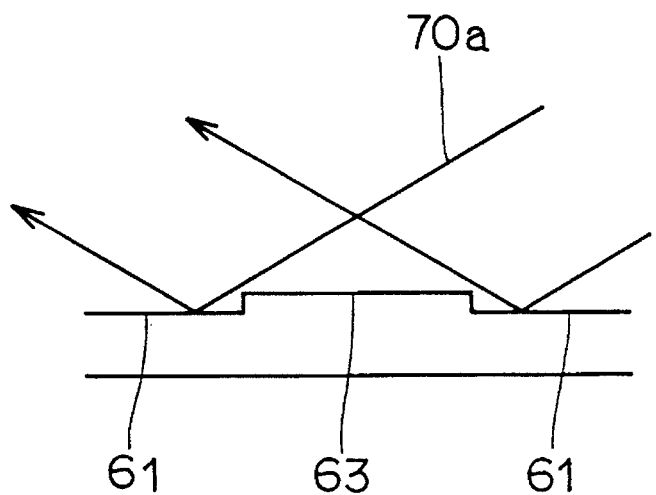
FIG. 17 is a schematic side view showing a state that radiated laser beams protrude from a repetitive region.

An exposing step in the embodiment of the invention differs from the conventional exposing step shown in FIG. 10 particularly in focusing step (step 130).

Figure 1:
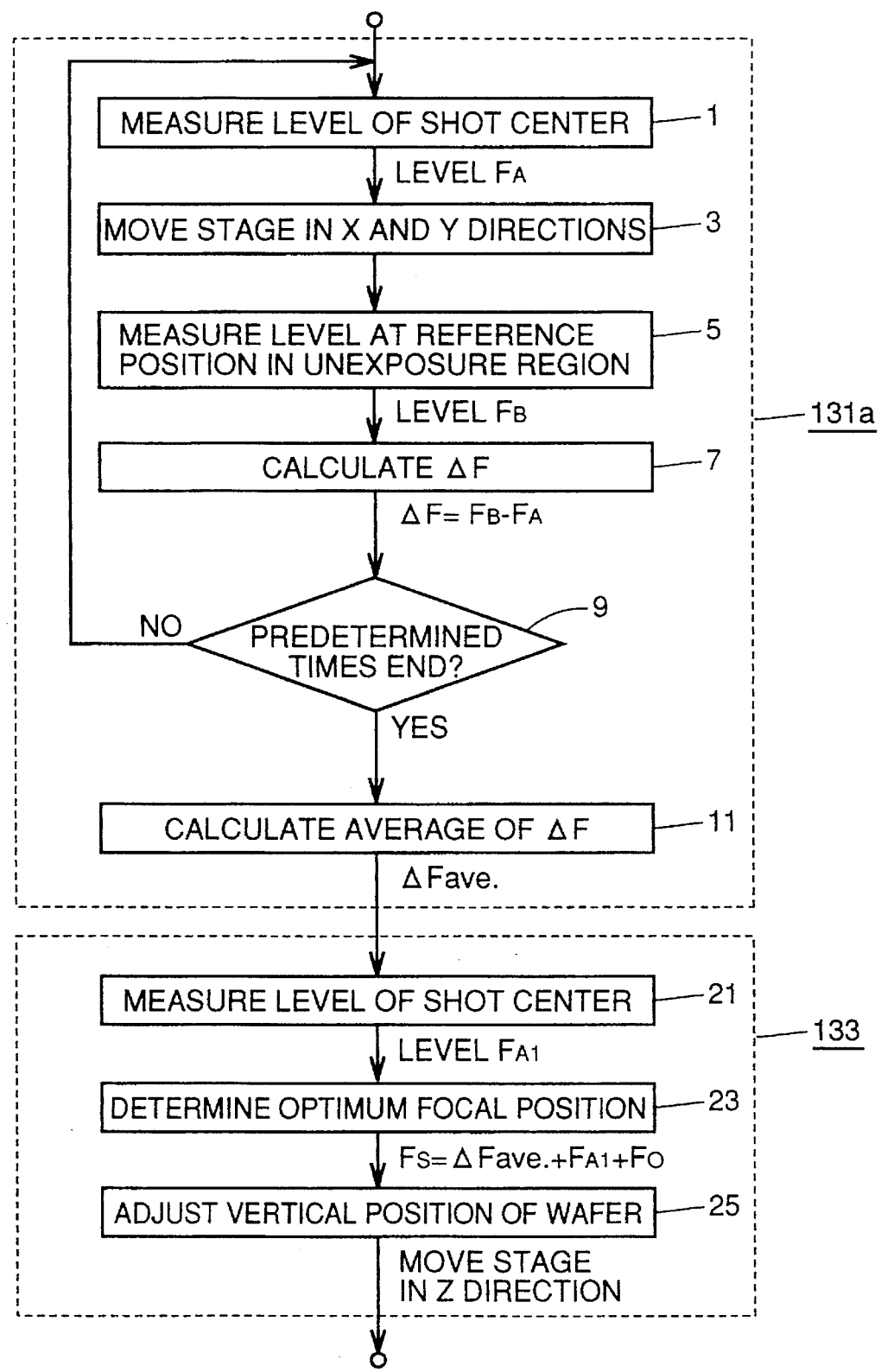
FIG. 1 is a flow chart showing focusing steps of an embodiment of the invention and specifically showing a level difference measuring step and a focal position adjusting steps.
Figure 2:
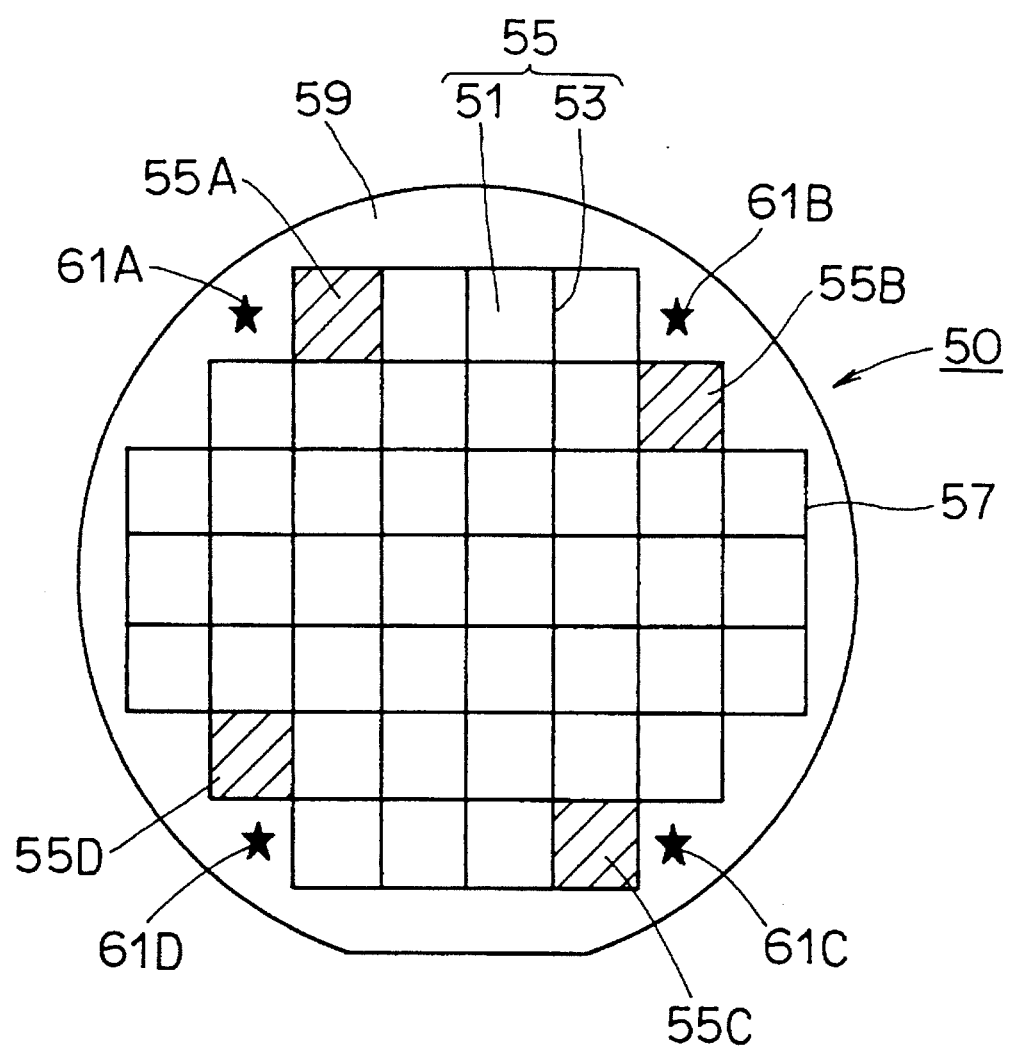
FIG. 2 is a schematic plan of a wafer showing an exposure region formed of a plurality of shot regions and a nonexposure region.

Referring to FIG. 1, a semiconductor wafer is transported into a step-and-repeat photolithographic system with demagnification, and alignment is performed. Thereafter, a predetermined number of shots are specified among a plurality of shots. Thus, shots 55A, 55B, 55C and 55D hatched in FIG. 2 are specified among a plurality of shots 55 in wafer 50.

A region 57 formed of all shots 55 is a region to which exposure light will be radiated, and thus is a so-called exposure region. A region 59 other than the above is a region to which the exposure light will not be radiated, and thus is a so-called nonexposure region. Shots 55 include chip regions 51 and dicing line regions 53 located between the chip regions.

Figure 3:
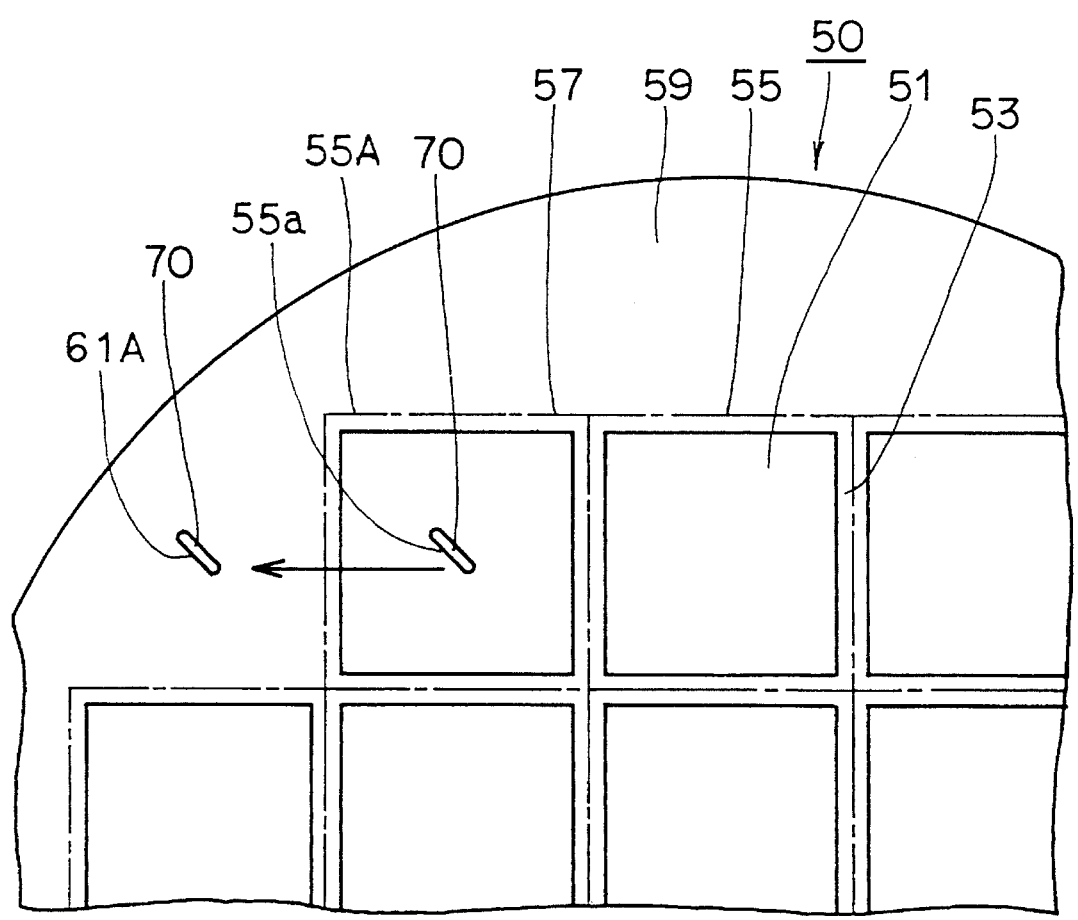
FIG. 3 is a plan showing, on an enlarged scale, a portion of the wafer in FIG. 2.

Then, a level $F_A$ of a central portion of one shot 55 among the specified shots 55 is measured (step 1 in FIG. 1). More specifically, laser beams 70 are radiated, for example, to a position (shot center) 55a to be deemed as a substantially central portion of the specified shot 55A as shown in FIG. 3, and the level is measured based on the intensity of reflected beams of laser beams 70.

Then, an X-Y stage moves predetermined distances in the X and Y directions (step 3 in FIG. 1). Thereby, the radiation position of laser beams 70 is set at a reference position 61A within nonexposure region 59 and outside the shot as shown in FIG. 3.

Laser beams 70 are radiated to reference position 61A to measure a level $F_B$ of reference position 61A based on the intensity of reflected beams (step 5 in FIG. 1).

Then, step 7 in FIG. 1 is executed to obtain a level difference ΔF between levels of shot center 55a in specified shot 55A and reference position 61A in nonexposure region 59. More specifically, as shown in FIG. 4, level difference ΔF is equal to a value ($F_B$–$F_A$) obtained by subtracting level $F_A$ of shot center 55a from level $F_B$ of reference position 55C forming the reference surface.

Figure 4:
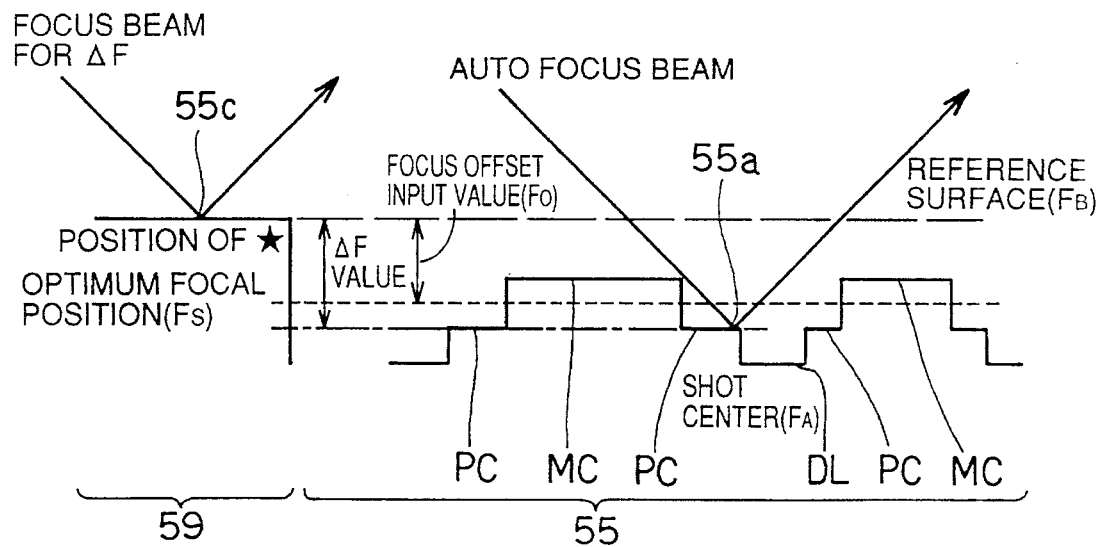
FIG. 4 is a schematic cross section showing calculation of an optimum focal position in the case where a shot center is set at a peripheral circuit region.
Figure 5:
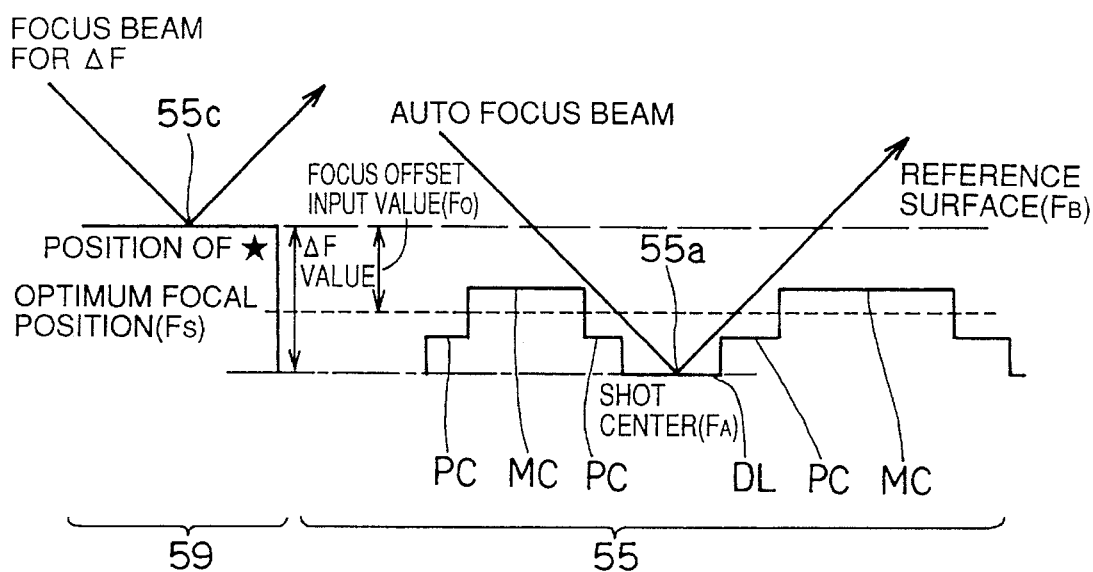
FIG. 5 is a schematic cross section showing calculation of an optimum focal position in the case where a shot center is set at a dicing line region.

FIG. 4 is a fragmentary cross section of the wafer showing a structure where shot center 55a is located at a peripheral region PC. A structure where the shot center may be located at a dicing line region DL as shown in FIG. 5.

Calculation of level difference ΔF in the above manner is repeated for all of other specified shots 55B, 55C and 55D (step 9 in FIG. 1). After level difference ΔF is calculated for all the specified shots, an average value $ΔF_{ave}$ of level differences (ΔF) at the respective shots is calculated (step 11 in FIG. 1).

After calculation of average value $ΔF_{ave}$ of the level differences at the specified shots, the focal position adjustment (step 133) and exposure with the beams focused onto the focal position (step 140) are performed for the respective shots in the step-and-repeat manner as shown in FIG. 10.

Referring mainly to FIG. 1, focal position adjusting step 133 is executed as follows. Initially, a level $F_{A1}$ of the shot center at each shot to be exposed is measured (step 21).

Then, an optimum focal position $F_s$ is determined based on level $F_{A1}$ of the shot center, average value $ΔF_{ave}$ of level differences obtained by the above level difference measuring step and a focus offset $F_0$ (step 23 in FIG. 1). More specifically, as shown in FIG. 4, optimum focal position (surface) $F_s$ is determined by adding average value $ΔF_{ave}$ and focus offset $F_0$ to level $F_{A1}$ ($F_A$) of the shot center, i.e., based on ($F_{A1}+ΔF_{ave}+F_0$).

Focus offset $F_0$ has been obtained in advance.

Then, the X-Y stage is vertically moved in the Z-direction (direction of height) with respect to the reducing projection lens so as to focus the exposure light onto optimum focal position $F_s$ (step 25 in FIG. 1).

Thereafter, exposure is executed as already described with reference to FIG. 10 (step 140), and more specifically, focusing and exposing are successively performed for respective shots. Steps other that the above are the substantially same as the conventional steps, and thus will not be described below.

According to the focusing method in photolithography of the above embodiment, the reference surfaces are formed of predetermined surfaces 61A, 61B, 61C and 61D of wafer 50 located within nonexposure region 59 as shown in FIG. 2. Since a pattern is not formed at nonexposure region 59, it has a substantially flat surface. Although sizes corresponding to one shot 55 cannot be ensured in nonexposure region 59, a planar occupied area larger than the repetitive pattern in one shot 55 can be ensured in nonexposure region 59. Therefore, it is easy to ensure a region of sizes, from which the spot of radiated laser beams does not protrude, in nonexposure region 59. A region having a flat surface can be ensured regardless of kinds of chips such as DRAM and ASIC. Therefore, the level of reference surface can be measured accurately, and thus the optimum focal position can be accurately obtained based on this level of reference surface. Accordingly, failure in pattern configurations can be suppressed in photolithography, even if elements are integrated to a higher extent.

The embodiment has been described in connection with the structure in which a major surface of wafer 50 is ensured as a region of shot 55, and a portion in which sizes of shot 55 cannot be ensured forms nonexposure region 59. However, the invention is not restricted to this structure. Thus, a region which is generally set as shot 55 may be set as the nonexposure region not exposed to exposure light. For example, hatched regions 59a, 59b, 59c, 59d, 59e and 59f in FIGS. 6 and 7 may be provided as the nonexposure regions, and the reference positions forming the reference surfaces may be set at these nonexposure regions 59a–59f.

Figure 6:
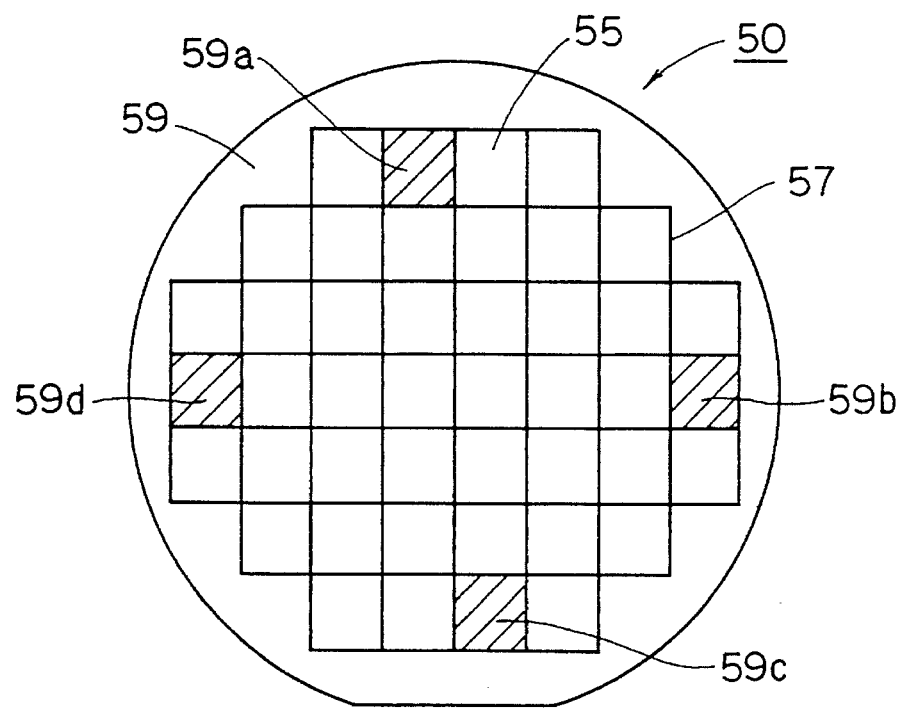
FIG. 6 is a schematic plan of a wafer in which a nonexposure region is formed at a peripheral portion of a region which usually forms an exposure region.
Figure 7:
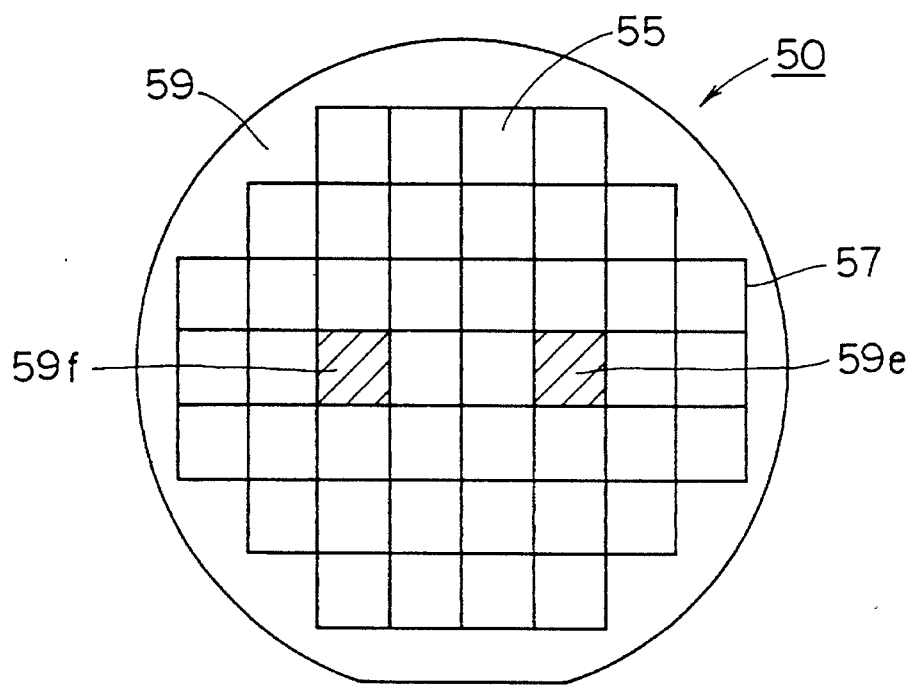
FIG. 7 is a schematic plan of a wafer in which a nonexposure region is formed at a central portion of a region which usually forms an exposure region.
Figure 8:
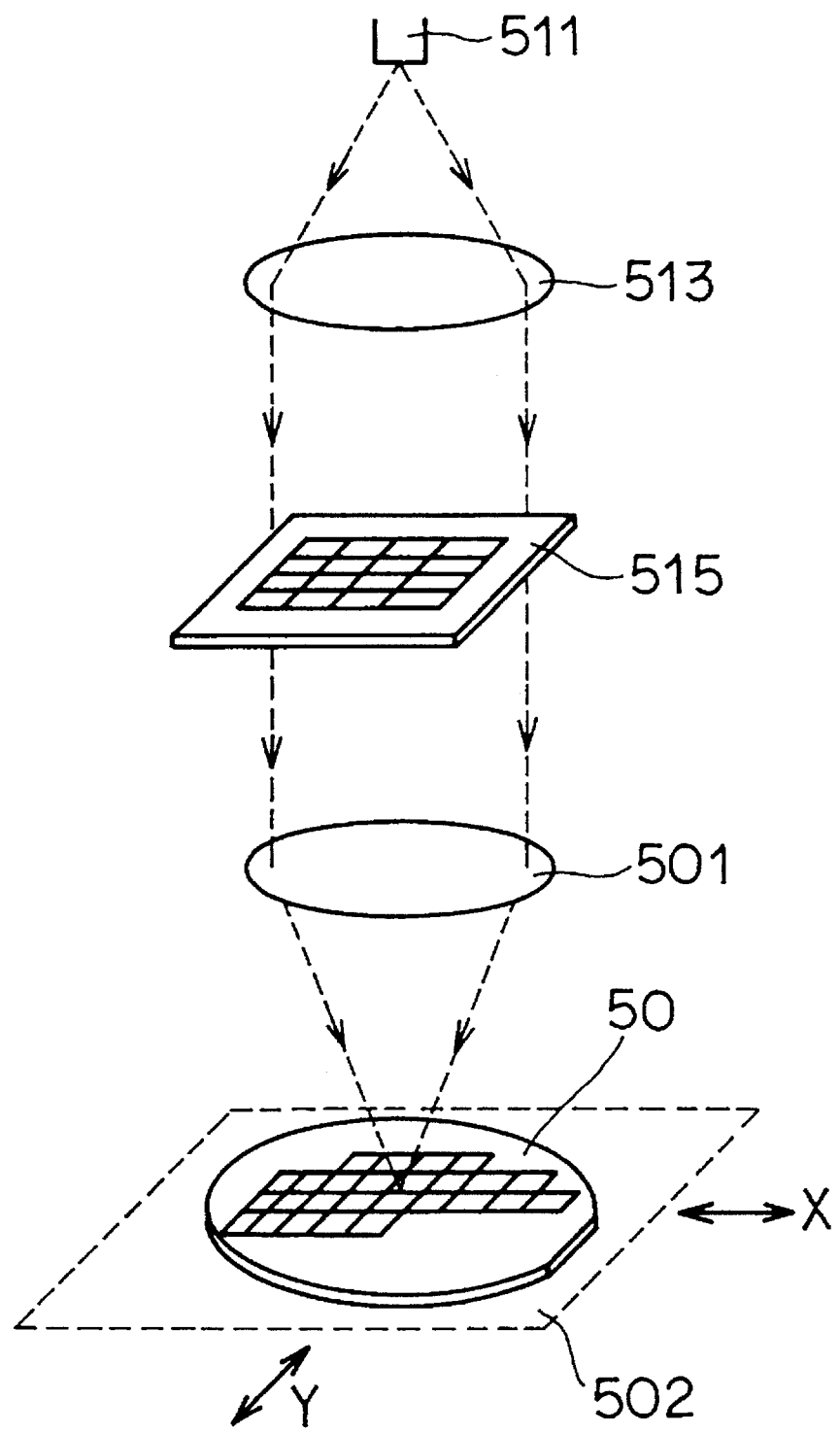
FIG. 8 is a schematic perspective view showing a principle of exposure in a step-and-repeat photolithographic system with demagnification.
Figure 9:
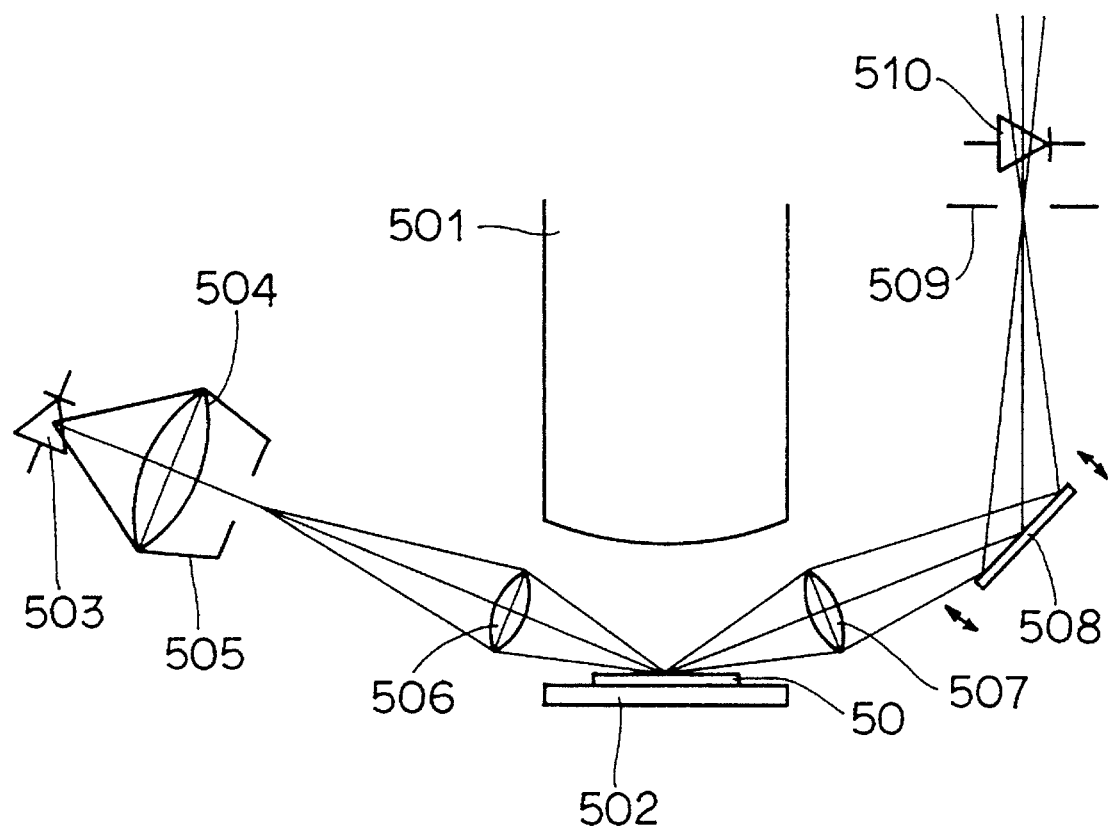
FIG. 9 is a schematic side view showing an automatic focusing mechanism in a step-and-repeat photolithographic system with demagnification.

In FIG. 6, nonexposure regions 59a–59d are regions to be usually located at the outermost periphery of the exposure region as the shots. In FIG. 7, nonexposure regions 59e and 59f are located relatively near the center of the exposure region, and are set at positions surrounded by shot regions 55.

According to the focusing method in photolithography of the invention, the wafer surface within the nonexposure region forms the reference surface. Since this region is not exposed to the exposure light and is not provided with the chip, it has a substantially flat surface. It is easy to ensure in this region the sizes which prevent protrusion of the spot of radiated laser beams. Accordingly, the level of reference surface can be measured accurately, and thus failure in pattern configurations can be suppressed even if elements are integrated to a higher extent.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A focusing method in photolithography, in which, for a process of successively transferring a mask pattern through a reducing projection lens onto each of predetermined regions of a surface of a wafer in a step-and-repeat manner so as to expose the surface of said wafer to provide a first region formed of a plurality of said predetermined regions exposed to exposure light and a second region not exposed to the exposure light, focusing of said exposure light is performed for each of said predetermined regions prior to irradiation of said exposure light, said method comprising the steps of:

measuring a surface level at a first predetermined position in a specified predetermined region among said plurality of predetermined regions;

measuring a surface level at a second predetermined position in said second region;

calculating a level difference between the surface level at said first predetermined position and the surface level at said second predetermined position;

measuring a surface level at a third predetermined position corresponding to said first predetermined position in said predetermined region arbitrarily selected from said plurality of predetermined regions;

determining an optimum focal position at said arbitrarily selected predetermined region based on said level difference and the surface level at said third predetermined position; and adjusting a positional relationship between said wafer and said reducing projection lens so as to focus said exposure light onto said optimum focal position.

2. The focusing method in photolithography according to claim 1, wherein said wafer includes a plurality of chip regions, and all of said chip regions are located within said first region.

3. The focusing method in photolithography according to claim 1, wherein said second region is located at a peripheral portion of the surface of said wafer and surrounds said first region.

4. The focusing method in photolithography according to claim 1, wherein said second region includes a portion surrounded by said first region.

5. A focusing method in photolithography, in which, for a process of successively transferring a mask pattern through a reducing projection lens onto predetermined regions of a surface of a wafer in a step-and-repeat manner so as to expose the surface of said wafer to provide a first region formed of a plurality of shot regions exposed to exposure light and a second region not exposed to the exposure light, focusing of said exposure light is performed for said plurality of shot regions prior to irradiation of said exposure light, said method comprising the steps of:

a) measuring a surface level at no more than one first position in a specified shot region among the plurality of shot regions;

b) measuring a surface level at least one second position in the second region;

c) calculating a level difference between the surface level at the no more than one first position and the surface level at the at least one second position;

d) repeating steps a) to c) a plurality of times using different shot regions and determining an average of calculated level differences;

e) measuring a surface level at no more than one third position, corresponding to the first position, in another shot region, different from the specified shot region, arbitrarily selected from the plurality of shot regions;

f) determining an optimum focal position at the arbitrarily selected shot region based on the average of calculated level differences and the surface level at the no more than one third position; and g) adjusting a positional relationship between the wafer and the reducing projection lens so as to focus the exposure light onto the optimum focal position.

* * * * *